Aug. 28, 1945. C. C. SHUMARD Re. 22,672

ELECTRONIC SWITCHING SYSTEM

Original Filed April 27, 1937 2 Sheets-Sheet 1

INVENTOR.
Charles C. Shumard
BY
H. S. Grover,
ATTORNEY.

Aug. 28, 1945. C. C. SHUMARD Re. 22,672

ELECTRONIC SWITCHING SYSTEM

Original Filed April 27, 1937 2 Sheets-Sheet 2

INVENTOR.
Charles C. Shumard
BY
H. S. Grover,
ATTORNEY.

Reissued Aug. 28, 1945

Re. 22,672

UNITED STATES PATENT OFFICE 22,672

ELECTRONIC SWITCHING SYSTEM

Charles C. Shumard, Moorestown, N. J., assignor to Radio Corporation of America, a corporation of Delaware Original No. 2,146,862, dated February 14, 1939, Serial No. 139,214, April 27, 1937. Application for reissue June 16, 1945, Serial No. 599,800

11 Claims. (Cl. 315—24)

This invention relates to electronic switching devices and is more particularly concerned with an arrangement whereby it is possible to control two, three, four or more circuits in such manner that the transient or other phenomena to be observed may, in effect, be simultaneously viewed on the luminescent screen of a cathode ray image producing tube. These patterns which are to be viewed are of the recurrent type and provisions are made according to the present invention whereby a switch operation may take place at a frequency well above the frequency of persistence of vision so that by electrically controlling the rate at which the different recurrent wave forms are switched or operatively connected to one of the deflecting circuits of the cathode ray image producing tube, it is possible to view and compare, if desired, the various recurrent wave forms one with the other.

In an arrangement of this type the rate at which the different recurrent phenomena are to be observed and the rate at which the switching of the application of the wave to one of the deflecting systems of the cathode ray image producing tube takes place is interlocked so that the directions along which the cathode ray beam is deflected are mutually perpendicular. In practice, it is usually desirable to so connect and arrange the connections that the various recurrent phenomena which are to be observed shall be applied to the beam deflection control system of the cathode ray image producing tube as to deflect the cathode ray beam across the luminescent screen along the vertical path, while the time during which each phenomenon is applied or impressed upon the deflection control for vertical deflection is coordinated with the rate at which the cathode ray beam is arranged to move in a substantially horizontal path from one edge of the luminescent screen to that edge opposite. This latter deflection is generally known as the time sweep and provisions are made according to the present invention by which the rate of application of the phenomena is definitely interlocked with the time sweep of the cathode ray beam. While it is usually preferable, as above stated, to apply the time sweep in the horizontal direction in contrast to the vertical, of course, it is to be understood that the invention, as it will be explained, is not in any way limited to this form of connection and may readily be applied in the opposite manner that is, for example, the time sweep applied in a vertical direction and the recurrent phenomena applied in a horizontal direction.

According to the prior art various suggestions have been made whereby a plurality of recurrent phenomena may, in effect, be observed simultaneously upon the luminescent screen of a cathode ray tube and the rate at which these observations are made to take place coordinate with the cathode ray beam deflection varied in accordance with time at some pre-established rate, it being understood that the time of commencement of reproduction of the recurrent phenomena always commences at the same phasal position of the time sweep.

It has already been suggested in the prior art to provide switching arrangements of these general types and such switching arrangements while heretofore usually of the so-called mechanical type have also to a limited extent utilized purely electronic means. However, according to the prior art, these systems were more or less complicated and did not in most instances provide for the rapidity of switching the rapidly triggering or flexibility of operation necessary where a great number of recurrent phenomena are to be simultaneously observed.

The present invention, therefore, has as its primary aim and object the provision of circuits which are extremely flexible in nature and which are readily adaptable to use for electronic switching for the simultaneous observation of recurrent phenomena where a number of phenomena to be simultaneously observed shall be two, three, four or any reasonably given number, the upper limit, of course, being determinable largely by frequency limitations of the possibility of distinguishing each of the complete phenomenon with respect to each other in order that the desired comparisons may be made. Therefore, provisions are made according to the present invention by which the rapidity of switching between the several phenomena to be observed may be readily accomplished through the use of grid controlled gaseous discharge tubes to which the recurrent phenomena to be observed are applied and which become sequentially operative to impress the several phenomena in sequence upon one of the deflection circuits of the cathode ray tube.

Still other objects of the invention reside in the provision of circuits for accomplishing the switching of the connection to be observed in sequence to the deflection circuits in a manner which is relatively simple and free from unusual complications and which at the same time will involve a minimum amount of equipment for utilization.

Still other objects and advantages of the invention will become apparent and at once suggest themselves to those skilled in the art to which the invention is directed by reading the following specification and claims in connection with the accompanying drawings wherein;

Figure 1:
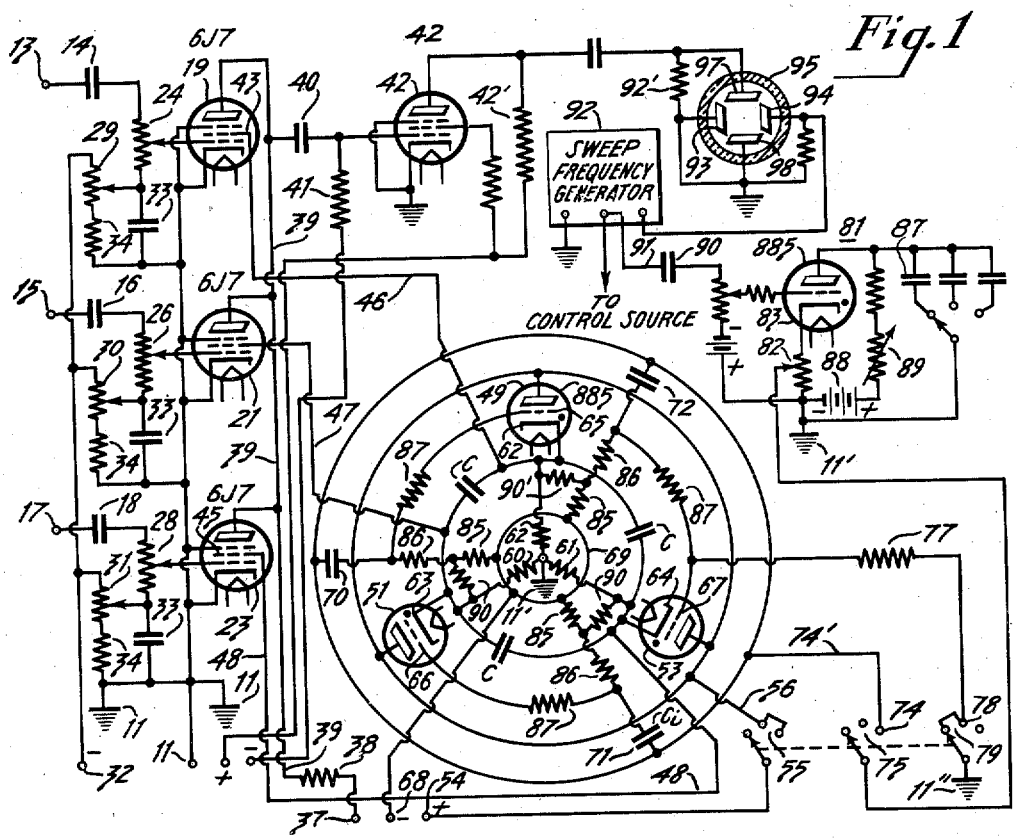
Figure 1 represents schematically a three-circuit electronic switch of the cathode shut-off type.

Referring to Fig. 1 and assuming, for instance that three separate phenomena are to be observed, these transients or phenomenon may be impressed between a ground 11 and the terminal points 13, 15 and 17 and capacity coupled by way of condensers 14, 16, 18 to the control electrode of three separate amplifying tubes 19, 21 and 23. In order to regulate the signal intensity applied to each of the control electrodes of the amplifying tubes 19, 21 and 23, suitable potentiometer connections are provided at 24, 26 and 28. One end of each potentiometer being connected to the input terminal through the condensers and the other end of each potentiometer is connected through a portion of a potentiometer 29, 30 or 31 to one terminal of a voltage source connected between ground and a terminal point 32 or as shown more particularly by the power supply means of Fig. 2. There is also connected in parallel with this path a second path comprising a condenser 33 and resistor 34 as well as the portion of the potentiometer 29 and the connection point between the condenser 33 and the resistor 34 connects to the supressor grid and the cathode of each of the amplifier tubes 19, 21 and 23.

While as shown each of these paths comprises potentiometers, condensers and resistances, it is, of course, to be understood that the values of these elements while usually made equal one to the other need not necessarily be so and the values assigned to the various elements of the circuit for convenience and for the purpose of disclosing suitable values of resistance and capacity which have been found to be satisfactory may be varied within reasonable limits without departing from the scope of the invention, the values being merely illustrative in nature and not in any sense limiting.

The output energy from the amplifying tubes 19, 21 and 23 respectively which have been supplied with plate voltage from a source connected between the ground 11 and a terminal point 37 by way of a resistor 38 are all connected in parallel by way of the conductor 39 and capacity coupled by way of the capacity and resistor combination 40, 41 to the input circuit of a common amplifying tube 42 whose output, as will be hereinafter explained, is applied across one pair of the deflecting electrodes of a cathode ray tube. Under normal conditions of operation all of the tubes 19, 21 and 23 are maintained in a biased state so as to be inoperative to draw plate current except at times when suitable triggering by the electron switching arrangement, to be herein described, is provided. The triggering operation is accomplished by controlling the voltage applied to the screen electrodes 43, 44 and 45 of these tubes and this is accomplished by connecting these screen electrodes respectively by conductors 46, 47 and 48 to suitable points on the electronic switching circuit.

Referring now to the electronic switching circuit which shall place the several tubes 19, 21 and 23 in a state to become sequentially operative, a plurality of tubes 49, 51 and 53 are provided which are equal in number to the number of separate inputs or phenomena to be observed. These tubes 49, 51 and 53 are arranged to become sequentially operative and to trigger the amplifier tubes 19, 21 and 23 in a predetermined sequence controlled in accordance with the sequence of operation of the tubes 49, 51 and 53. The tubes 49, 51 and 53 are preferably of the grid controlled gaseous discharge type since tubes of this nature when rendered operative have the property of substantially producing a uniform voltage drop for given current passing therethrough.

In the switching arrangement comprising the tubes 49, 51 and 53 the plate electrode of each of these tubes is energized from a common plate voltage supply (not shown) connected between ground and a terminal connection point 54 by way of the switch 55 and the conductors 56 and 57 and all of the cathode electrodes connect to a ground point 11′ by way of resistor elements 62′, 60 and 61. The conductors 46, 47 and 48 connect the screen electrodes 43, 44 and 45 of the tubes 19, 21 and 23 respectively to tubes 49, 51 and 53 and connect to the cathode electrodes 62, 63 and 64 of these last named tubes. The grid electrodes 65, 66 and 67 of tubes 49, 51 and 53 are supplied with suitable bias from a source (not shown) connected between ground and the terminal point 68 and poled negatively with respect to 68 by connecting through to the conducting ring 69 by way of suitable resistor elements so that the grid is biased negatively relative to the cathode under conditions when switching or operativeness of each individual tube does not take place. Connected to the grid electrodes of each of the tubes 49, 51 and 53 by way of condensers 70, 71 and 72 is an outer conductor 73 which connects to a terminal point 74 of a second switch 75. Also connected directly to the grid of one of the tubes 49, 51 or 53, or as shown specifically to the grid of the tube 53, is a second conductor 76 connected by way of a resistance 77 to terminal point 78 of the switch arm 79. Each of the switches 55, 75 and 79 is arranged to be operated in unison and to be switched between each of the three contact points shown so that in the position which the switch 55 has been shown there is no connection between the source of plate voltage for the tubes 49, 51 and 53 connected at terminal point 54 and the complete arrangement is in an inoperative state. Similarly, there is no connection established from the conducting member 73 to the terminal point 74 and the arm of the switch 75 but at this time there is established a connection between ground 11″ and the terminal point 78 by way of the arm of the switch 79 and the grid electrode of the tube 53. This connection preferably being made through the resistor 77 to a point on either side of the resistance 87.

Now to render the device operative the switches 55, 75 and 79 are moved in unison from the contact point at which the switch arms are shown to be resting over to the next adjacent point. In this instance plate voltage will be applied to each of the tubes 49, 51 and 53 but there will be no connection established between the conductor 73 and the arm of the switch 75 although the connection between the ground point 11'' and the grid electrodes of each of these tubes by way of the contact point 78, the resistor 77 and conductor 76 is well established. The condition established by the switch resting in its median position in such manner as to connect ground 11'' through the switch 79 and thereby connect directly point 78 through the resistance 77, conductor 76 to the grid 67 of the tube 53 produces a condition of un-symmetrical biasing of this grid with respect to the undisturbed bias existing on the grids 65 and 66 of the tubes 49 and 51. In this manner the tube 53 is transferred for operation upon the simultaneous shifting of switches 55, 74 and 79 to the extreme right position. Moving now the switching arms so that each rests upon the terminal point furthest to the right from the position in which the switch arms are shown, it will be seen that plate voltage is still applied to the plate electrodes of each of the tubes 49, 51 and 53 but that now there has been established, by way of the arm of the switch 75, a connection from the conductor member 73 to the conductor 80 into which impulse switch circuit 81 by way of the potentiometer connection 82 shown as connecting with the cathode of the impulse developing tube 83 as will be hereinafter explained. But now the connection between ground 11'' and the grid electrodes of each of the tubes 49, 51 and 53 has been broken.

In moving the switch arms from the position shown to the third position to the right it will be seen that the electronic switching device comprising the tubes 49, 51 and 53 is progressively conditioned for operation because plate voltage is supplied. The bias for rendering the several tubes inoperative is applied so that the sequence of operation is determined by the unsymmetrical bias on the grid of the tube 53. If now it is assumed that the switch arms have been moved to the furthest position to the right from that shown then it can be assumed, for instance, that the tube 53, for example, is first rendered operative to draw plate current. Thus immediately prior to this time there was applied to the grid 66 of tube 51 and grid 65 of tube 49 a biasing voltage from the source connected to the terminal point 68 which was applied through resistors 85, 86 and 87 so that the tubes 51, 49 are non-conducting. However, if tube 53 is rendered conducting then it will be appreciated that there occurs through the tube 53 and the resistor 61 connected between it and ground a voltage drop equal to the anode voltage connected between ground 11 and the terminal point 54 for the several tubes 49, 51, and 53. The usual voltage drop to be expected in a grid controlled gaseous discharge tube of the type of tube 53, hereinabove described and which, for example, may be of the type known in the art as the RCA885, is of the order of 16 volts. A suitable voltage for the source connected between ground 11 and terminal point 54 is of the order of 116 volts and therefore there occurs across the resistor 61 when tube 53 is drawing current, a voltage drop of the order of 100 volts, assuming the values above suggested. This, therefore, carries the terminal point of the resistor 61 connected to the cathode 64 highly positive with respect to its previous condition and there is applied therefore through resistors 90, 86, and 87, since tube 51 is not drawing grid current, a positive voltage which opposes the voltage applied between ground 11 and the terminal point 68 to bias the grid of the tube 51, and the tube 49 then commences to draw plate current while the tube 53 ceases to draw plate current because the potential of the cathode has risen so high with respect to its previous state that it approaches the anode potential and the tube ceases to operate. However, this operation is controlled more accurately as to time of occurrence by reason of the switch 75 being connected to the terminal point 74 and by way of the conductor 73 to the condensers 72, 71 and 70 and into the grid electrodes 67, 66 and 65 respectively of tubes 53, 51 and 49 which applies by virtue of the operation of the discharge tube 83 forming a part of the impulse sweep circuit which changes the potential at the point at which conductor 80 connected with the conductor 73 connects to the potentiometer 82, so that there is, in effect, applied to the grid electrodes of the tubes 49, 51 and 53 an auxiliary impulse transferred by way of the condensers 72, 71 and 70 and controls more accurately the time of operativeness of the tube 51. The triggering tube 83 is also of the grid controlled gaseous discharge type and serves to discharge the charge which has accumulated in one of the condensers 87 having been charged from a potential source 88 by way of the resistors 89. The grid electrode of the tube 83 connects by way of the capacity coupling 90 and conductor 91 to the conventionally shown sweep circuit generator 92 for providing horizontal or time deflection across the deflector plates 93, 94 of the cathode ray tube 95 of which only the neck portion is shown. The sweep circuit generator 92 may be of the usual type and also comprises a condenser charged from a source of constant current and arranged to be discharged in accordance with some suitable controlling impulse such, for example, as a recurrent 60 cycle signal or other frequency signal by way of either a so-called high vacuum discharge tube or another form of electronic discharge device such, for example, as a tube of the gaseous discharge type hereinabove described. Such sweep circuits are well known in the art and require no further explanation being merely conventional in nature.

Whenever one of the tubes of the switching ring comprising tubes 49, 51 and 53 becomes operative and plate current is drawn from the source connected between the ground 11 and the terminal point 54, as was above explained, the potential of the cathode of the tube instantaneously operative rises with respect to the plate potential because of the fact that very little of the total voltage drop of the plate supplying voltage is impressed across the tube and therefore at this instant when any one of the tubes 49, 51 and 53 becomes operative by way of connection of the conductor 48, for example, to the screen electrode 45 of the tube 23 and to the cathode 64 of the tube 53, the screen electrode of the amplifier 23 is carried highly positive after having been biased highly negative so that the tube 23 draws plate current and by way of the capacity resistance coupling to the tube 42 the phenomenon applied at the terminal point 17 is transferred and amplified through the tubes 23 and 42 to become impressed across the deflecting electrode pair 97, 98 of the cathode ray tube simultaneously with the application of the time deflecting voltage appearing across the electrodes 93, 94. In a manner similar to that above described as soon as the tube 53 has drawn plate current and at a frequency determined by the circuit constants that is, for example, the resistors 85, 86, 87 and particularly resistor 60 and condenser C, etc., and the frequency at which the discharge tube 83 operates and whose impulse is thereby impressed upon the grid electrodes 67 and the like, the several tubes 51, 49 and 53 et seq. are sequentially rendered operative. When the tube 51 is next rendered operative following an operation of the tube 53 by which is meant the drawing of plate current, the tubes 23, 21 and 19 again are sequentially rendered operative and the phenomena impressed continuously upon the terminal points 17, 15 and 13 are sequentially applied to the deflecting plate electrode pair 93, 94 of the cathode ray tube 95.

While according to Fig. 1 the number of amplifier tubes 19, 21 and 23 has been shown as being equal to the number of tubes 49, 53 and 51 of the switching circuit, it is, of course, obvious that each of the tubes 19, 21 and 23 may be replaced by a pair of tubes connected in push-pull whereby their inputs are balanced relative to ground in the usual manner. If now, for a further understanding of this disclosure, it is assumed that the tube 51 is inoperative then there is applied to the screen grid 45 of the tube 23, for example, a biasing voltage which is determined by the resistance of the resistor 61 times the value of the biasing voltage negatively applied to the terminal 68 and between this terminal and ground all divided by the sum of the resistance values of the resistor 61, 90 and 85. The same conditions will also obtain throughout the remainder of the circuit with respect to other tubes so that during conditions of inoperativeness of the grid tubes 19, 21 and 23, there is applied to the screen grid electrodes a negative bias which is removed in sequence as the tube to whose cathode the screen grid is connected commences to draw plate current. Of course, under these conditions the biasing voltages on the screen electrodes of the tubes 19, 21 and 23 are applied at all times except when one of these tubes is to be brought to an operative state and, in this event, the tubes are consecutively rendered operative by the removal of the biasing voltage and the application of a positive voltage to the screen electrode to cause a relatively heavy flow of plate current.

Figures 2, 3:
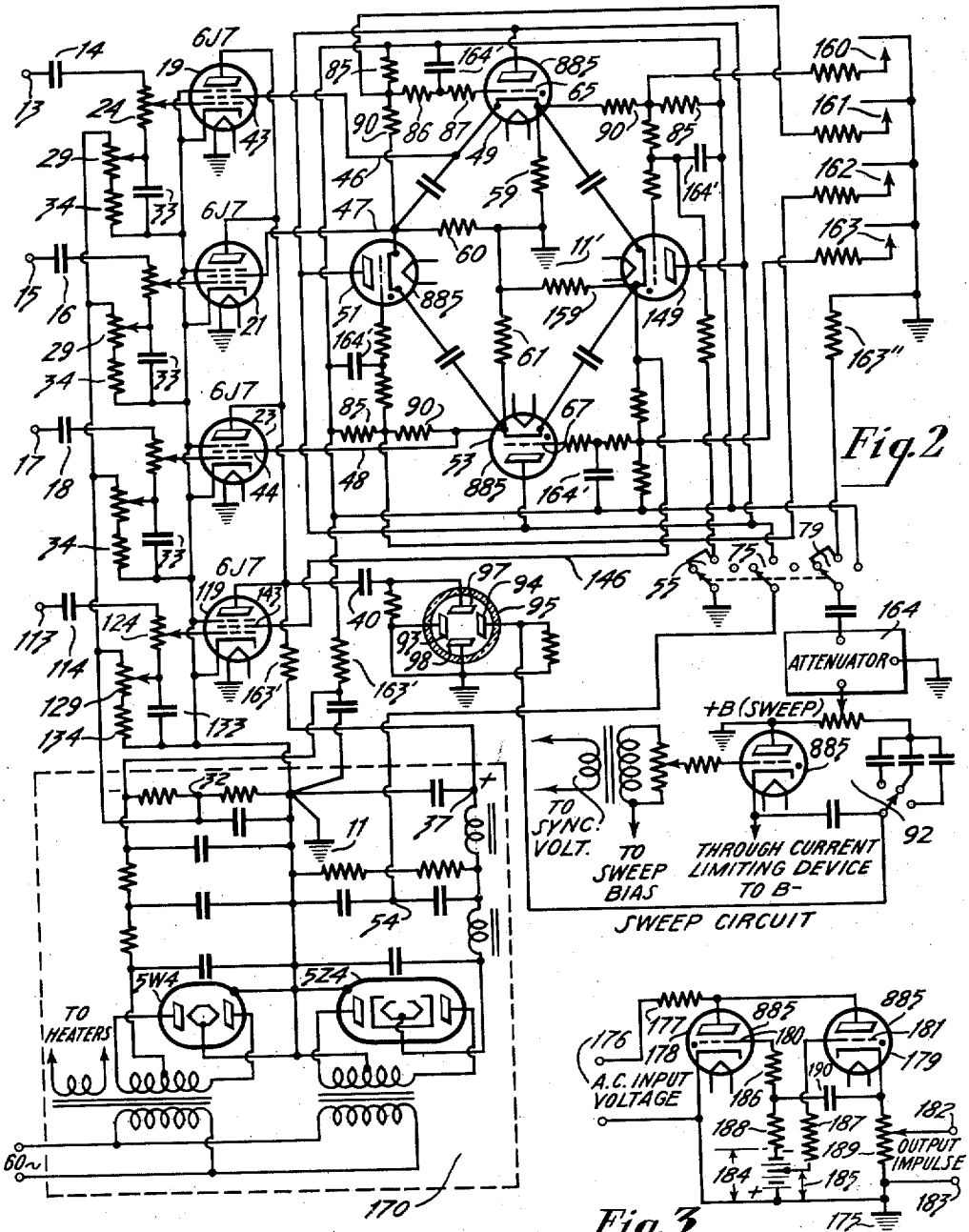
Figure 2 represents a modification of the arrangement of Fig. 1 applied to an increased number of switch circuits, and shows particularly a modified form of coupling.
Figure 3 represents still a further modification.

Referring now to Fig. 2, there is disclosed an arrangement for switching and supplying signals to the deflection plates of a cathode ray tube and this arrangement represents a modification of that shown by Fig. 1. As was above suggested the electronic switching arrangement herein disclosed is adaptable for use with a considerable number of input signal sources and the switching may embody the sequential and consecutive switching of say *n* phenomenon to a load circuit.

By the arrangement disclosed by Fig. 2 there has been set forth an adaptation of the system of Fig. 1 expanded to include four separate signal sources controlled consecutively and sequentially by electronic switching apparatus. The general nature of this arrangement follows that shown by Fig. 1 insofar as it provides a common biasing source of energy for each of the several tubes of the electronic switch comprising the tubes 149, 53, 51 and 49 and the control of the amplifying means is, as in Fig. 1, also of the cathode shut-off type by which is meant that the control of the bias applied to the amplifier tubes is dependent upon whether or not the tubes of the switching arrangement are in a conducting (that is operating) or a non-conducting (that is biased or non-operating) condition. In contrast to the arrangement shown by Fig. 1 where the tube 53 was the first tube of the sequence to operate by the removal of the bias therefrom during the changing of the position of the switch 79, provision is made for the use of a plurality of manually operable switches 160, 161, 162 and 163 for initiating the operation of any of the several tubes 149, 49, 51 and 53 respectively. If desired an attenuator 164 with suitable matching impedance may be used for supplying impulses from the sweep circuit 92 for initiating the operation, at the selected frequency of the sweep circuit.

The power supply 170 purely of a conventional type with a good voltage regulation is arranged to supply operating voltages as was shown conventionally by the terminal point connections in Fig. 1. Throughout the remainder of Fig. 2 like parts of Fig. 1 have been referred to by similar numerical indications and the additional tube necessary for the four-circuit switching has been referred to by numeral indications like the first tube but increased by one hundred.

In some instances it may be desirable to trigger an electronic switch from an alternating current supply of approximately sinusoidal wave form. While this would not be the usual case since it is more frequently desirable to provide a triggering impulse of steep wave front, a sweep circuit may be synchronized from an A. C. supply source by providing an arrangement of the general type herein shown by Fig. 3.

Referring now to Fig. 3 the two tubes 178 and 179, each of which is preferably of the grid controlled gaseous discharge type, have their plate electrodes energized from a suitable source of alternating current input of an assumed voltage value *e* which is connected between the plate electrodes of the tubes 178 and 179 and a ground point 175. The cathodes of the tubes 178 and 179 also connect to this ground point, either directly or through suitable resistors. The bias voltage 185 supplied between the grid 181 of the tube 179 and ground 175 is so adjusted that when the A. C. input supplied at source 176 reaches a predetermined value the tube 179 momentarily becomes conducting with the result that a voltage drop takes place across the resistor 189 so that the terminal point of this resistor connected to the cathode of the tube 178 becomes highly positive relative to its previous condition and approaches the potential on the plate electrode of this tube. Due to the connection from the terminal of resistor 189 connected to the cathode of tube 179 the grid electrode 180 of the tube 178 has its effective bias which has been supplied from the bias source 184 lowered by way of the connection through the condenser 190 and the resistor 186 to the grid electrode 180 by the voltage drop taking place under conditions of conductivity of tube 179 through resistor 188. Normally, the bias voltage 184 exceeds the voltage 185 but when the effective bias applied to the grid 180 by the source 184 is lowered the tube 178 commences to conduct and draw current, and the tube 179 is substantially short-circuited. At this time the tube 179 is cut-off since only the voltage drop of tube 178 exists across the whole of the tube 179 shunt circuit. Tube 178 will shut off shortly before the input voltage *e* supplied at 176 goes negative. In this manner it will be seen that one impulse per cycle of input is obtained at the output impulse terminals 182 and 183.

In this arrangement the resistor 177 serves to limit the current through the tube 178 and also serves to provide regulation. The resistors 187 and 186 limit the grid current flowing while the resistor 188 serves as a coupling medium. According to usual practice the resistance 189 should usually be kept small and the resistors 177 and 188 may be of the same order. In accordance with this arrangement the time constant of the impulse produced across the output terminals 182 and 183 by the connection made to the resistor 189 is approximately equal to the sum of the resistance values 189 and 188 times the capacity 190.

Figure 4:
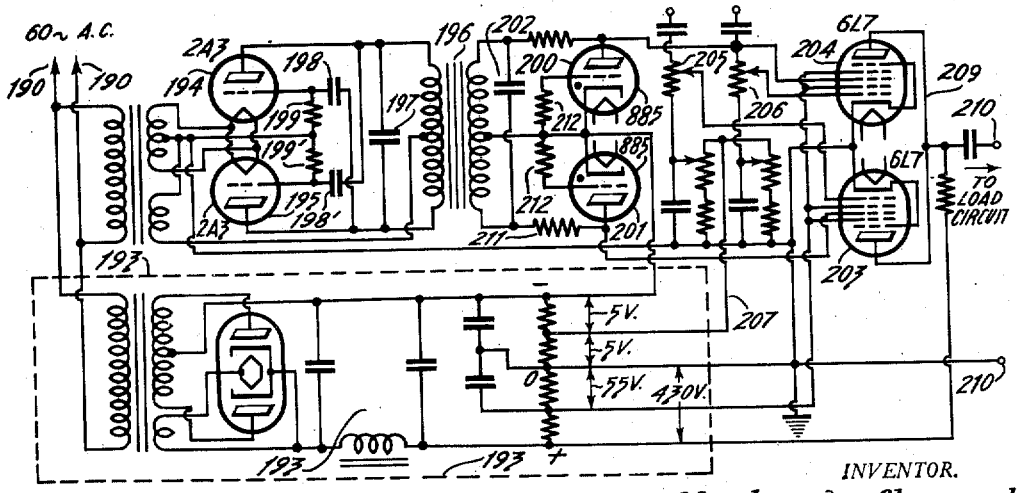
Figure 4 shows a form of switching arrangement particularly adapted to switching under the control of alternating currents obtained directly from a power supply source.

A still further modification of the invention as applied to a two-circuit switch and wherein the control is provided from an A. C. source, such as a 60 cycle supply, has been shown by Fig. 4. Referring now to this modification of the invention the impresssed alternating currents used both for power supply and for controlling the switching time provided for the observation of the two phenomena supplied at the terminal points 191 and 192 are connected at terminals 190 for the purpose of controlling this switching operation as well as for supplying through a suitable supply unit 193 operating voltages. The impressed alternating currents applied at the terminals 190 when used to control the operation of the switching of the impresssed phenomena appearing at the terminals 191 and 192. For the purpose of providing the switching operation control from the A. C. supply and permitting the observation of at least a full cycle of the switch signal, the frequency of the switching voltage should preferably be a maximum of one-quarter of the switch signal frequency, since the transient switching time is an appreciable part of a cycle. Since such a frequency is usually not available whereas the 60 cycle A. C. is readily obtainable from the power supply the arrangement of Fig. 4 is suitable for obtaining this frequency relationship.

The oscillator tubes 194 and 195 (preferably of the type known in the art as 2A3) are connected with the plate electrodes connecting to opposite end terminals of the primary of the transformer 196 which is center-tapped back to the cathode. The transformer primary is shunted by a condenser 197 and cross-connected between the grid of tube 194 and the plate of tube 195 is a connection including condenser 198 of which the terminal connected nearest to the grid of tube 194 is connected by a resistor 199 back to the plate circuit. Similar connections including condenser 198' and resistor 199' are provided for tube 196. In this arrangement the constants are preferably so chosen that the oscillator oscillates at an assumed frequency of 15 cycles, assuming the frequency of the A. C. supply at terminals 190 to be 60 cycles.

A pair of gaseous discharge tubes 200 and 201 of the grid controlled type, such for example as tubes known in the art as the type 885, have their plate electrodes connected respectively to the end terminals of the secondary of transformer 196, across which is connected the condenser 202.

The phenomena applied at terminals 191 and 192 are supplied to the control electrode of tubes 203 and 204 respectively by way of the voltage dividers 205 and 206 and one of the grids of each of these tubes also connects with the plate electrode of the tubes 201 and 202. The grids of tubes 203 and 204 are suitably biased as shown and plate potentials for these tubes are supplied from the power supply 193. By way of the connection 207 from the cathode connection of tubes 200 and 201 the voltage drop from the plate to cathode of the tubes 200 and 201 may be utilized to bias the tubes 204 and 203 to control the operative periods of each. In accordance with the time periods when either of the tubes 200 or 201 is made conducting by virtue of the energy supplied at the terminal of the secondary of transformer 196 rising in the positive sense, either of the tubes 203 or 204 is positively biased and the signals impressed at the terminals 191 and 192 are amplified and transferred by way of the parallel output connection 209 to the terminal points 210 and utilized either for the purpose of controlling the deflection of a cathode ray beam or for the purpose of determining which of the plurality of impressed signals is effective in the load circuit connected with these terminals points.

The arrangement for applying the biasing voltages to the various grids of the tubes 203 and 204 are quite analogous to the arrangements already described and are not herein repeated again in detail. It will be seen that the resistors 211 serve to limit the plate current flowing through the tubes 200 and 201 whereas the grid resistors 212 serve to limit the grid current. These values are not critical but by way of example may be of the order of 5000 to 15,000 ohms.

Referring now further to Figs. 1 and 2, it will be noted that in connection with Fig. 2 the impulse from the attenuator 164 is applied across the resistor 163' through the condensers 164', when the switch 79 is on the contact furthest to the right but otherwise through the resistor 163'' and the manual switches where resistor 163'' is preferably made equal to the resistor 163'. This is in contrast to the arrangement of Fig. 1 where the impulse is applied only through the condensers 70, 71 and 72. With the arrangement of Fig. 2, the condensers 164' are not absolutely essential but serve to decrease attenuation and the amount of impulse voltage required. Thus, at the higher frequencies the resistance 163' can be omitted and coupling established only by way of condensers 164', while at the lower frequencies only the resistance 163' need be used. It may be further worth noting that with the arrangement of Fig. 2, that where the resistance 60 is relatively small relative to resistances 90 and 85, that the screen voltage on the tubes 19, 21, etc., is substantially zero.

While in connection with the showing of Fig. 1 various values suitable for the various resistance and capacity elements shown have been tabulated immediately beneath the figure of the drawings, these values have been given merely by way of example and are not to be construed as limiting in any manner but rather as illustrative of one suitable set of operating constants. Further the general arrangement described by the several figures of the drawings herein, while having been illustrated, especially in connection with the simultaneous viewing of different patterns on a cathode ray tube screen, is in no sense limited to these applications. While it is not desired to specifically enumerate each of the possible uses of the invention, it might be pointed out that the amplifier tubes 19, 21, etc., associated with the switching circuit, including the tubes 49, 51, 53, etc., may be adjusted to supply from their plate mixing circuit stepped direct current voltages, either by adjusting each individual control grid bias, or by tapping the switch voltage for different screen grid bias to each amplifier tube. Further, by the use of the arrangement herein shown separate oscillators, amplifiers or other apparatus may be effectively switched by electronically switching some controlling voltages so that audio tones of different amplifiers, for example, could be observed at low frequency switching or musical tones could be produced.

Still other varied uses of the invention will immediately become apparent to those skilled in the art and therefore it is desired that the disclosure be construed as covering all forms of switching systems which fall clearly within the spirit and scope of the hereinafter appended claims.

What I claim is:—

1. An electronic switching device comprising a network including a plurality of electron tubes each having grid, cathode and anode electrodes, a common source of anode potential for all of said tubes, circuit connections including a plurality of resistance elements connecting the cathode electrode of each tube of the network to the grid of the next succeeding tube in the sequence and the grid of the last tube of the sequence to the cathode of the first tube of the sequence, a common source of voltage for supplying cut-off biasing potentials upon the grid electrodes of all of the tubes for normally maintaining the several tubes inoperative, switching means for reducing, upon starting, the biasing voltage on one of the tubes to a value to permit the tube to draw plate current, means for subsequently rendering the several tubes in the sequence sequentially and consecutively operative following the initial operation of the first tube of the sequence, a plurality of sources of signal energy and amplifying means associated with each of the sources, a load circuit connected with the output of the amplifying means, means for normally maintaining the amplifying means inoperative and means for rendering the amplifying means sequentially and consecutively operative at time periods of operation of the sequentially operating tubes to connect thereby the amplifying means to the load circuit.

2. An electronic switching device comprising a plurality of thermionic tubes arranged in a sequence, each of said tubes having grid, cathode and anode electrodes, a common source of anode potential for all of said tubes, a circuit comprising a plurality of resistance elements connecting the cathode of each of the tubes to the grid of the next succeeding tube in the sequence and the grid of the last tube of the sequence to the cathode of the first tube of the sequence, means for supplying cut-off biasing potentials upon the grid electrodes of all of the tubes, means for reducing, upon starting, the biasing voltage on one of the tubes to a value to permit the tube to draw plate current, means for rendering the tubes in sequence sequentially operative following the initial operation of the first tube of the sequence, a plurality of sources of signal energy and amplifying means associated with each of the sources, a control from each of the individual amplifying means to one of the said tubes of the first-namel sequence whereby the amplifying means are rendered sequentially operative in accordance with the operation of the tubes of the first-named sequence, a common output connection for all of the amplifying means, and a load circuit for utilizing the output of the said amplifying means, said load circuit comprising a cathode ray tube having deflection circuits for deflecting the developed cathode ray beam in a plurality of mutually perpendicular directions, and means for supplying the output of the parallelly connected amplifying means to one of the deflection circuits of the cathode ray tube.

3. An electronic switching device comprising a plurality of thermionic tubes each having grid, cathode and anode electrodes and arranged to operate in a predetermined sequence, a common source of anode potential for all of said tubes, a circuit comprising a plurality of resistance elements connecting the cathode of each of the tubes to the grid of the next succeeding tube in sequence and the grid of the last tube of the sequence to the cathode of the first tube of the sequence, means for supplying cut-off biasing potentials upon the grid electrodes of all of the tubes for normally maintaining the tubes inoperative, means for reducing, upon starting, the biasing voltage on one of the tubes to a value to permit the tube to draw plate current, means for rendering the tubes in the sequence sequentially and consecutively operative following the initial operation of the first tube of the sequence, a plurality of sources of signal energy and amplifying means associated with each of the sources, a control from each of the individual amplifying means to one of the said tubes of the first named sequence for normally maintaining the amplifying tubes inoperative and means for rendering the amplifying means sequentially operative at time periods coinciding with the periods of operation of the tubes of the first named sequence, a parallel output connection for all of the amplifying means, and a load circuit for utilizing the output of the said amplifying means.

4. An electronic switching device comprising a plurality of thermionic tubes each having grid, cathode and anode electrodes and arranged to operate in a predetermined sequence, a common source of anode potential for all of said tubes, a circuit comprising a plurality of resistance elements connecting the cathode of each of the tubes to the grid of the next succeeding tube in the sequence and the grid of the last tube of the sequence to the cathode of the first tube of the sequence, means for supplying cut-off biasing potentials upon the grid electrodes of all of the tubes for normally maintaining the tubes inoperative, means for reducing, upon starting, the biasing voltage on one of the tubes to a value to permit the tube to draw plate current, means for rendering the tubes in the sequence sequentially and consecutively operative following the initial operation of the first tube of the sequence, a plurality of sources of signal energy and amplifying means associated with each of the sources, a control from each of the individual amplifying means to one of the said tubes of the first named sequence for normally maintaining the amplifying tubes inoperative and means for rendering the amplifying means sequentially operative at time periods coinciding with the periods of operation of the tubes of the first named sequence, a parallel output connection for all of the amplifying means, and a load circuit for utilizing the output of the said amplifying means, said load circuit comprising a cathode ray tube having deflection circuits for deflecting the developed cathode ray beam in a plurality of mutually perpendicular directions, and means for supplying the output of the parallelly connected amplifying means to one of the deflection circuits of the cathode ray tube.

5. The system claimed in claim 1 wherein said load circuit comprises a cathode ray tube, and means for supplying the output from the amplifier to the cathode ray tube to deflect the cathode ray beam developed therein in one of two mutually perpendicular directions.

6. The system claimed in claim 3 wherein said load circuit comprises a cathode ray tube, and means for supplying the output from the amplifier to the cathode ray tube to deflect the cathode ray beam developed therein in one of two mutually perpendicular directions.

7. A system claimed in claim 2 comprising, in addition, a sweep frequency generator for deflecting the cathode ray beam developed in the cathode ray tube in a direction perpendicular to the path of deflection initiated by the output of said parallelly connected amplifying means, and means interconnected between the sequentially operative tubes and the deflection control means for interlocking the sequential operation and the deflection control whereby the said tubes of the sequence are rendered sequentially operative at predetermined time periods in the deflection of the cathode ray beam in the direction perpendicular to the direction of deflection provided by the parallelly connected outputs from the amplifying means.

8. A system claimed in claim 4 comprising, in addition, a sweep frequency generator for deflecting the cathode ray beam developed in the cathode ray tube in a direction perpendicular to the path of deflection initiated by the output of said parallelly connected amplifying means, and means interconnected between the sequentially operative tubes and the deflection control means for interlocking the sequential operation and the deflection control whereby the said tubes of the sequence are rendered sequentially operative at predetermined time periods in the deflection of the cathode ray beam in the direction perpendicular to the direction of deflection provided by the parallelly connected outputs from the amplifying means.

9. An electronic switching device comprising a network including a plurality of electron tubes each having at least a control electrode, a cathode and an anode, a source of anode potential for all of said tubes, circuit connections including a plurality of impedance elements connecting the cathode of each tube of the network to the control electrode of the next succeeding tube of the sequence and the control electrode of the last tube of the sequence to the cathode of the first tube of the sequence, means for supplying cut-off biasing potentials upon the control electrodes of all of the tubes for normally maintaining the several tubes inoperative, switching means for altering, upon starting, the biasing voltage on one of the tubes to a value to permit the tube to draw current, means for subsequently rendering the several tubes in the sequence operative sequentially following the initial operation of the first tube of the sequence, a plurality of sources of signal energy and amplifying means associated with each of the sources, a load circuit connected with the output of the amplifying means, means for normally maintaining the amplifying means sequentially and consecutively operative at time periods of operation of the sequentially operating tubes to connect thereby the amplifying means to the load circuit.

10. An electronic switching system comprising a plurality of signal energy channels, a relay device connected with each signal channel, a load circuit connected to be energized from the relays, a switching network including a plurality of electron tubes each having at least a control electrode, a cathode and an anode, a source of anode potential for all of said tubes, circuit connections including a plurality of impedance elements connecting the cathode electrode of each tube of the network to the control electrode to the next succeeding tube in the sequence and the control electrode of the last tube of the sequence to the cathode of the first tube of the sequence, means for supplying biasing potentials upon the control electrodes of all of the tubes for normally maintaining the several tubes in one of two equilibrium states of operativeness, switching means for altering, upon starting, the bias voltage on one of the tubes to a value to permit the tube to change to the other of the two equilibrium states of operativeness, means for subsequently changing the several tubes of the sequence to the last named equilibrium state of operativeness sequentially following the initial change in the operative state of the first tube of the sequence, means for normally maintaining each relay inoperative to energize its associated load circuit, and means provided by said switching network for rendering the several relays operative in sequence to energize the load circuit in accordance with the presence and absence of signals upon the plurality of signal energy channels.

11. An electronic switching system comprising a plurality of signal energy channels, a relay device connected with each signal channel, a load circuit connected to be energized from said relays, a switching network including a plurality of electron tubes each having at least a control electrode, a cathode and an anode, a source of anode potential for all of said tubes, circuit connections for connecting the cathode circuit of each tube of the network to the control electrode circuit of the next succeeding tube in the sequence and the control electrode circuit of the last tube of the sequence to the cathode circuit of the first tube of the sequence, means for supplying biasing potentials of one polarity upon the control electrodes of all of the tubes for normally maintaining the several tubes in one of two equilibrium states of operativeness, an impedance element connected in each cathode circuit, switching means connected with the impedance elements for altering, upon starting, the voltage on one of the tubes to a value to permit the tube to change to the other of the two equilibrium states of operativeness, means for subsequently changing the several tubes of the sequence to the last named equilibrium state of operativeness sequentially following the initial change in the operative state of the first tube of the sequence, means for normally maintaining each relay inoperative to energize its associated load circuit, and means provided by said switching network for rendering the several relays operative in sequence to energize the load circuit in accordance with the presence and absence of signals upon the plurality of signal energy channels.

CHARLES C. SHUMARD.